United States Patent
Leong

(10) Patent No.: US 10,224,924 B1
(45) Date of Patent: Mar. 5, 2019

(54) BIDIRECTIONAL SWITCH WITH PASSIVE ELECTRICAL NETWORK FOR SUBSTRATE POTENTIAL STABILIZATION

(71) Applicant: Infineon Technologies Austria AG, Villach (AT)

(72) Inventor: Kennith Kin Leong, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/683,217

(22) Filed: Aug. 22, 2017

(51) Int. Cl.
*H03K 17/22* (2006.01)
*H03K 17/16* (2006.01)
*H01L 29/778* (2006.01)
*H01L 27/07* (2006.01)
*H01L 27/06* (2006.01)
*H01L 29/78* (2006.01)
*H01L 29/205* (2006.01)

(52) U.S. Cl.
CPC ....... *H03K 17/161* (2013.01); *H01L 27/0605* (2013.01); *H01L 27/0727* (2013.01); *H01L 29/7787* (2013.01); *H01L 29/205* (2013.01); *H01L 29/7831* (2013.01)

(58) Field of Classification Search
CPC ..... H03K 17/22; H03K 17/223; H03K 17/161
See application file for complete search history.

(56) References Cited

U.S. PATENT DOCUMENTS

| | | | | |
|---|---|---|---|---|
| 7,595,680 B2 * | 9/2009 | Morita | ................. | H03K 17/302 327/427 |
| 7,852,137 B2 * | 12/2010 | Machida | ............. | H01L 27/0605 327/427 |
| 7,868,353 B2 | 1/2011 | Machida et al. | | |
| 8,344,424 B2 | 1/2013 | Suh et al. | | |
| 8,604,512 B2 * | 12/2013 | Morita | ................ | H01L 27/0605 257/133 |
| 9,443,845 B1 * | 9/2016 | Stafanov | ............... | H01L 29/407 |
| 2012/0217542 A1 | 8/2012 | Morita et al. | | |
| 2014/0203289 A1 | 7/2014 | Liu et al. | | |
| 2014/0264431 A1 | 9/2014 | Lal | | |

(Continued)

FOREIGN PATENT DOCUMENTS

EP 3249815 A1 11/2017

*Primary Examiner* — Hai L Nguyen
(74) *Attorney, Agent, or Firm* — Murphy, Bilak & Homiller, PLLC

(57) ABSTRACT

A device includes a semiconductor body having an active region and a substrate region that is beneath the active region. A bidirectional switch is formed in the semiconductor body having first and second gate structures that are configured to block voltage across two polarities as between first and second input-output terminals that are in ohmic contact with the electrically conductive channel. First and second switching devices are configured to electrically connect the substrate region to the first and second input-output terminals, respectively. A passive electrical network includes a first capacitance connected between a control terminal of the first switching device and the second input-output terminal and a second capacitance connected between a control terminal of the second switching device and the first input-output terminal. The passive electrical network is configured temporarily electrically connect the substrate region to the first and second input-output terminal at different voltage conditions.

19 Claims, 8 Drawing Sheets

(56) References Cited

U.S. PATENT DOCUMENTS

2014/0374766 A1 12/2014 Bahl et al.
2015/0180469 A1 6/2015 Kim
2016/0079233 A1 3/2016 Deboy et al.

* cited by examiner

BIDIRECTIONAL SWITCH WITH PASSIVE ELECTRICAL NETWORK FOR SUBSTRATE POTENTIAL STABILIZATION

TECHNICAL FIELD

The instant application generally relates to semiconductor devices, and more particularly relates to bidirectional high electron mobility transistors.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN.

HEMTs are viewed as an attractive candidate for power transistor applications, i.e., applications in which switching of substantially large voltages and/or currents is required. HEMTs offer high conduction and low resistive losses in comparison to conventional silicon based devices.

HEMTs are commonly formed from III-V semiconductor materials, such as GaN, GaAs, InGaN, AlGaN, etc. In a GaN/AlGaN based HEMT, a two-dimensional electron gas (2DEG) arises at the interface between the AlGaN barrier layer and the GaN buffer layer. The 2DEG forms the channel of the device instead of a doped region, which forms the channel in a conventional MOSFET device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Normally-off structures are also possible. In these cases, measures must be taken to prevent the channel region of an HEMT from being in a conductive state in the absence of a positive gate voltage.

One application of type III-V semiconductor technology is a bidirectional switch. A bidirectional switch is a device that is capable of switching voltages of positive or negative polarity. That is, a bidirectional switch is configured to control current flow in both directions. A dual gate type III-V semiconductor bidirectional switch can be realized by providing two HEMT gate structures in series between two electrically conductive terminals that are in contact with the two-dimensional carrier gas. The two HEMTs can share the same drift region (the resistive voltage sustaining part) of the device which means the on-state resistance can be approximately half of a conventional back to back device.

One problem associated with bidirectional switches relates to capacitive coupling between the channel of the device and the underlying semiconductor substrate. In conventional unidirectional semiconductor switching devices, the underlying semiconductor substrate is typically tied to the reference potential terminal (e.g., the source terminal) of the device by substrate contacts. By tying the substrate to a fixed potential, the problem of capacitive coupling between a floating substrate and the channel is eliminated and hence the reliability and stability of the device operation is improved. The same benefit cannot be obtained using a simple electrical contact in the case of a bidirectional switch because there is not a single terminal that is maintained at a reference potential in all states of operations; the voltage polarity across the device changes. Known solutions to this problem suffer from various drawbacks.

SUMMARY

A semiconductor device is disclosed. According to an embodiment, the semiconductor device includes a semiconductor body having an active region and a substrate region that is disposed beneath the active region. A bidirectional switch is formed in the semiconductor body and is configured to block voltage across two polarities. The bidirectional switch includes first and second gate structures that are each configured to control a conductive state of an electrically conductive channel that is disposed in the upper active region, and first and second input-output terminals that are each in ohmic contact with the electrically conductive channel. A first switching device is configured to electrically connect the substrate region to the first input-output terminal. A second switching device is configured to electrically connect the substrate region to the second input-output terminal. A passive electrical network includes a first capacitance and a second capacitance. The first capacitance is connected between a control terminal of the second switching device and the first input-output terminal. The second capacitance is connected between a control terminal of the first switching device and the second input-output terminal. The passive electrical network is configured to temporarily electrically connect the substrate region to the second input-output terminal by turning the second switching device on when the second input-output terminal is at a higher potential than the first input-output terminal. The passive electrical network is configured to temporarily electrically connect the substrate region to the first input-output terminal by turning the first switching device on when the first input-output terminal is at a higher potential than the second input-output terminal.

According to another embodiment, the semiconductor device includes a semiconductor body having an active region and a substrate region that is disposed beneath the active region. A bidirectional switch is formed in the semiconductor body and is configured to block voltage across two polarities. The bidirectional switch includes first and second gate structures that are each configured to control a conductive state of an electrically conductive channel that is disposed in the upper active region, and first and second input-output terminals that are each in ohmic contact with the electrically conductive channel. A first switching device is configured to electrically connect the substrate region to the first input-output terminal when turned on. A second switching device is configured to electrically connect the substrate region to the second input-output terminal when turned on. A passive electrical network is configured to generate a first substrate reference signal that turns the second switching device on during a first transitional state of the bidirectional switch and to generate a second substrate reference signal that turns the first switching device on during a second transitional state of the bidirectional switch. The first transitional state is a state when the second input-output terminal is at a higher potential than the first input-output terminal and the bidirectional switch is turned on, the second transitional state is a state when the first input-output terminal is at a higher potential than the second input-output terminal and the bidirectional switch is turned on.

A method of operating a bidirectional switch is disclosed. The bidirectional switch is configured to block voltage across two polarities. The bidirectional switch includes a semiconductor body having an active region and a substrate region that is disposed beneath the active region, first and second gate structures that are each configured to control a conductive state of an electrically conductive channel that is disposed in the upper active region, and first and second input-output terminals that are each in ohmic contact with the electrically conductive channel. According to an embodiment of the method, the second switching device is used to temporarily electrically connect the substrate region to the second input-output terminal during a first transitional state of the bidirectional switch. The first transitional state of the bidirectional switch is a state when the second input-output terminal is at a higher potential than the first input-output terminal and the bidirectional switch is transitioned from OFF to ON. A first switching device is used to temporarily electrically connect the substrate region to the first input-output terminal during a second transitional state of the bidirectional switch. The second transitional state of the bidirectional switch is a state when the first input-output terminal is at a higher potential than the second input-output terminal and the bidirectional switch is transitioned from OFF to ON. Using the first switching device and using the second switching device includes turning the first and second switching devices on using a passive electrical network that that generates a current pulse from transitioning of the bidirectional switch.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, illustrates equivalent circuit schematics of the bidirectional switch in two different operational states, according to an embodiment. FIG. 2A depicts the bidirectional switch in an OFF state. FIG. 2A depicts the bidirectional switch in an ON state.

DETAILED DESCRIPTION

According to embodiments described herein, a bidirectional switch is disclosed with substrate voltage regulation circuit connected between the input-output terminals of the bidirectional switch and the substrate region of the bidirectional switch. The bidirectional switch includes switching devices (e.g., transistors) that are configured to connect the input-output terminals of the bidirectional switch to a substrate region, depending upon the operational state of the bidirectional switch. If the bidirectional switch is operating at a first voltage polarity wherein a second input-output terminal is at a higher potential than a first input-output terminal and is transitioned from OFF to ON, a first switching device electrically connects the substrate region to the second input-output terminal. If the bidirectional switch is operating at a second voltage polarity wherein the first input-output terminal is at a higher potential than the second input-output terminal and is transitioned from OFF to ON, a second switching device electrically connects the substrate region to the first input-output terminal.

Advantageously, the bidirectional switch includes a passive electrical network that can provide the necessary control signaling to turn the first and second switching devices ON and OFF without any independent biasing or control signals. That is, the passive electrical network is self-biasing in the sense that it utilizes the same voltages that are applied across the input-output terminals of the bidirectional switch to generate the control signaling for the first and second switching devices. In one particular example, the passive electrical network includes capacitors that are connected in series with the control terminals of current driven switches. The transition from OFF to ON of the bidirectional switch results in a temporary redistribution of charges across the capacitor network that causes a current pulse to appear at the control terminal of the appropriate switching device. Advantageously, this solution can be integrated into a single integrated circuit. For example, a GaN based bidirectional switch can be combined with GaN based current driven switching devices and integrally formed capacitances to provide the complete circuit. This provides a simpler and more cost effective solution in comparison to a technique that utilizes discrete components and external biasing signals to provide similar functionality.

Figure 1:
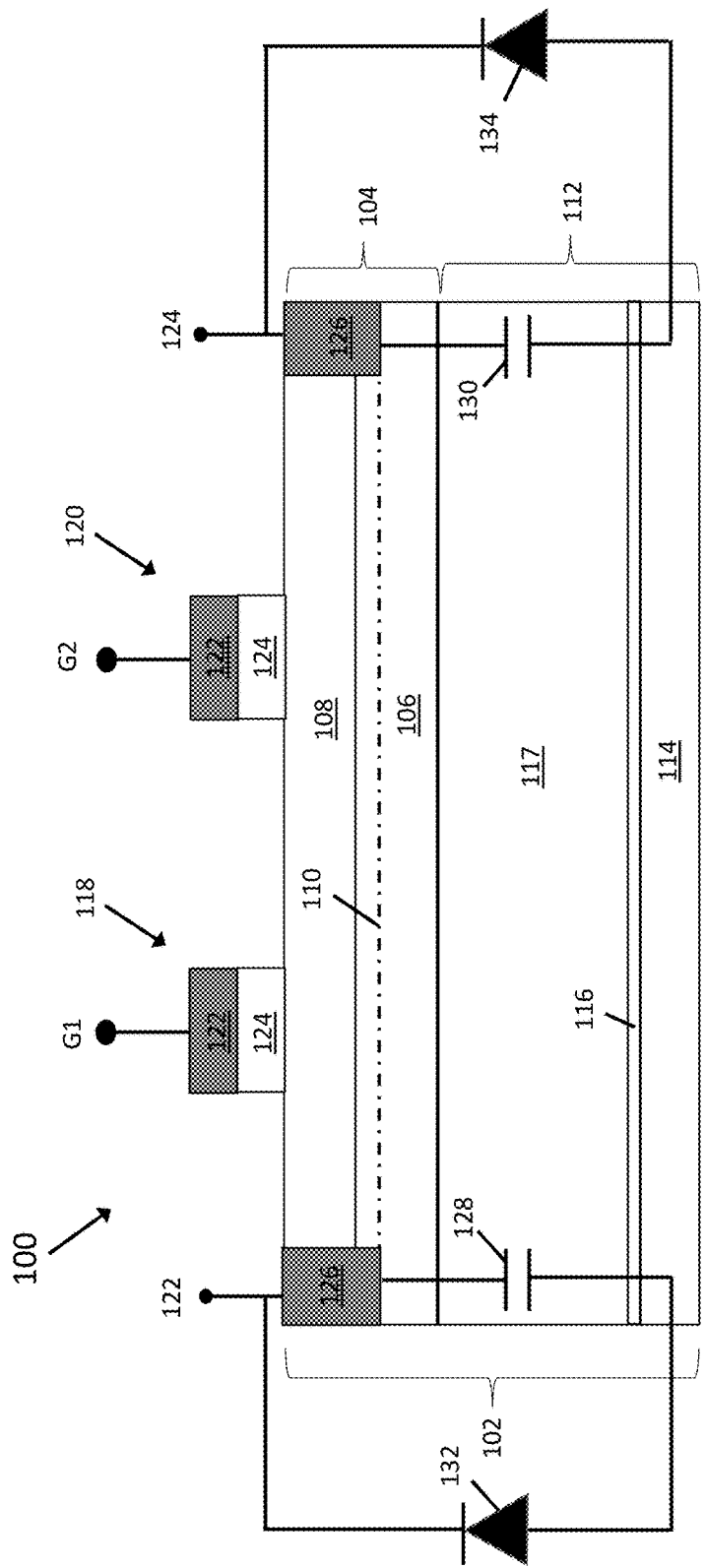
FIG. 1 illustrates a bidirectional switch with a network of diodes connected between the input-output terminals of the bidirectional switch and the substrate region of the bidirectional switch, according to an embodiment.

Referring to FIG. 1, a bidirectional switch 100 is depicted, according to an embodiment. The bidirectional switch 100 is formed in a semiconductor body 102. Generally speaking, the semiconductor body 102 region can include a wide variety of semiconductor materials including group IV semiconductor materials such as Silicon (Si), compound group IV semiconductor materials such as Silicon carbide (SiC) or Silicon germanium (SiGe), and group III-V semiconductor materials such as gallium nitride (GaN), aluminum gallium nitride (AlGaN), indium gallium nitride (InGaN), gallium arsenide (GaAs), aluminum gallium arsenide (AlGaAs), as well as isolation materials such as sapphire, etc.

A top portion of the semiconductor body 102 includes an upper active region 104. The upper active region 104 refers to the layers or regions of the semiconductor body 102 that provide an electrically conductive channel. For example, in the depicted embodiment, the upper active region 104 includes first and second type III-V semiconductor layers 106, 108. The second type III-V semiconductor layer 108 is formed from a semiconductor material having a different band gap than the first type III-V semiconductor layer 106. For example, the first type III-V semiconductor layer 106 can include intrinsic or lightly doped gallium nitride (GaN) and the second type III-V semiconductor layer 108 include aluminum gallium nitride (AlGaN). More generally, any combination of type III-V semiconductor materials with different metallic contents can be used to provide a difference in bandgap. Due to the difference in bandgap between the first and second type III-V semiconductor layers 106, 108, an electrically conductive two-dimensional charge carrier gas channel 110 arises near an interface between the first type III-V semiconductor layer 106 and the second type III-V semiconductor layer 108 due to polarization effects. Alternatively, instead of type III-V semiconductor material, the upper active region 104 can include group IV semiconductor materials such as Silicon (Si), Silicon carbide (SiC), Silicon germanium (SiGe), etc. The materials can be doped to form active device regions, e.g., source, drain, collector, emitter, etc., which provide a controllable electrically conductive channel in a known manner.

A lower portion 112 of the semiconductor body 102 includes various regions of the semiconductor body 102 that do not directly contribute in an electrical sense to the provision of the electrically conductive channel 110. In the depicted embodiment, the lower portion 112 of the semiconductor body 102 includes a substrate region 114, a nucleation layer 116, and a lattice transition region 117. The substrate region 114 can include can be formed from group IV or group III-V semiconductor materials. For example, according to one embodiment, the substrate region 114 can be provided by a silicon or silicon based wafer. The nucleation layer 116, which may include a metal nitride (e.g., AlN), and the lattice transition region 117, which may include a number of semiconductor nitride (e.g., AlGaN) layers with a gradually diminishing metallic content, are provided on the substrate region 114 to enable the formation of relatively strain and defect free group IV semiconductor material thereon. More generally, the substrate region 114 can include any intrinsic or bulk portion of the substrate that is beneath the active device regions, and is more conductive than an intermediary region that is between the substrate region 114 and the upper active region 104.

The bidirectional switch additionally includes first and second gate structures 118, 120 that are formed on the semiconductor body 102. The first and second gate structures 118, 120 each include an electrically conductive gate electrode 122, semiconductor body 102. According to one embodiment, the intermediary regions 124 are configured (e.g., by doping) to provide an integrated diode in the gate structure. In the case of a type III-V semiconductor device, the first and second gate structures 118, 120 may be configured to alter the intrinsically conductive state of the two-dimensional charge carrier gas channel 110. semiconductor body 102.

The bidirectional switch 100 additionally includes first and second input-output terminals 122, 124 that are in ohmic contract with the channel 110. The ohmic connection can be provided by electrically conductive contact structures 126 that are formed in the semiconductor body 102. These contact structures 126 can be formed from conductive metals, such as tungsten or aluminum, or alternatively can be formed from highly-doped monocrystalline or polycrystalline semiconductors.

The bidirectional switch 100 operates as follows. At a first voltage polarity, in which the second input-output terminal 124 is at a higher voltage than the first input-output terminal 122, voltage blocking is primarily handled by the first gate structure 118. That is, an "OFF" signal applied to the first gate structure 118 (e.g., 0V, relative to the first input-output terminal 122) will disrupt the channel 110 and causes the device to be in a blocking mode. The bidirectional switch 100 becomes conductive by applying an "ON" signal (e.g., a positive voltage, relative to the first input-output terminal 122) to the first gate structure 118, which places the channel 110 in a conductive state. At a second voltage polarity, in which the first input-output terminal 122 is at a higher voltage than the second input-output terminal 124, the opposite applies. That is, voltage blocking is primarily handled by the second gate structure 120. In this way, the bidirectional switch 100 can block or permit a current to flow in either direction between the first and second input-output terminals 122, 124. The bidirectional switch 100 can have symmetrical voltage blocking capability at either voltage polarity. Alternatively, the bidirectional switch 100 can be configured to have a greater voltage blocking capability at one of the two voltage polarities. This can be achieved by, among other things, adjusting the distance between the first and second gate structures 118, 120 and the first and second input-output terminals 122, 124.

One problem associated with bidirectional switch 100 that are integrated into a single substrate, as is the case in the device of FIG. 1, is the so-called "common substrate" problem. In the absence of any further measures, there is a parasitic capacitive coupling that occurs between the first and second input-output terminals 122, 124 and the substrate region 114. In the figure, a first substrate capacitance 128 represents the parasitic capacitance between the first input-output terminal 122 and the substrate region 114, and a second substrate capacitance 130 represents the parasitic capacitance between the second input-output terminal 124 and the substrate region 114. If the substrate region 114 is not tied to a fixed potential, the voltages across these parasitic capacitances can vary during the operation of the device, which may degrade the channel and affect the switching behavior during operation of the bidirectional switch 100. In a conventional unidirectional device, this problem is typically solved by tying the substrate of the device to the same potential as the reference potential terminal (e.g., the source terminal) and thus shunting the parasitic substrate capacitance. However, this solution is not available in a bidirectional device because there is no dedicated reference potential terminal. That is, the first input-output terminal 122 acts as a reference potential at one voltage polarity and the second input-output terminal 124 acts as a reference potential at the opposite voltage polarity.

The semiconductor device depicted in FIG. 1 additionally includes a network of first and second diodes 132, 134, which represent one known solution to the so-called "common substrate" problem. The first and second diodes 132, 134 are schematically represented in FIG. 1. In principle, these diodes can be integrally formed in the semiconductor body 102 and electrically connected in the depicted manner using known interconnect techniques. Alternatively, these diodes can be provided using discrete devices that are separate from the bidirectional switch 100. The anode of the first diode 132 is connected to the substrate region 114 and the cathode of the first diode 132 is connected to the first input-output terminal 122. The anode of the second diode 134 is connected to the substrate region 114 and the cathode of the second diode 134 is connected to the second input-output terminal 124.

Figure 2:
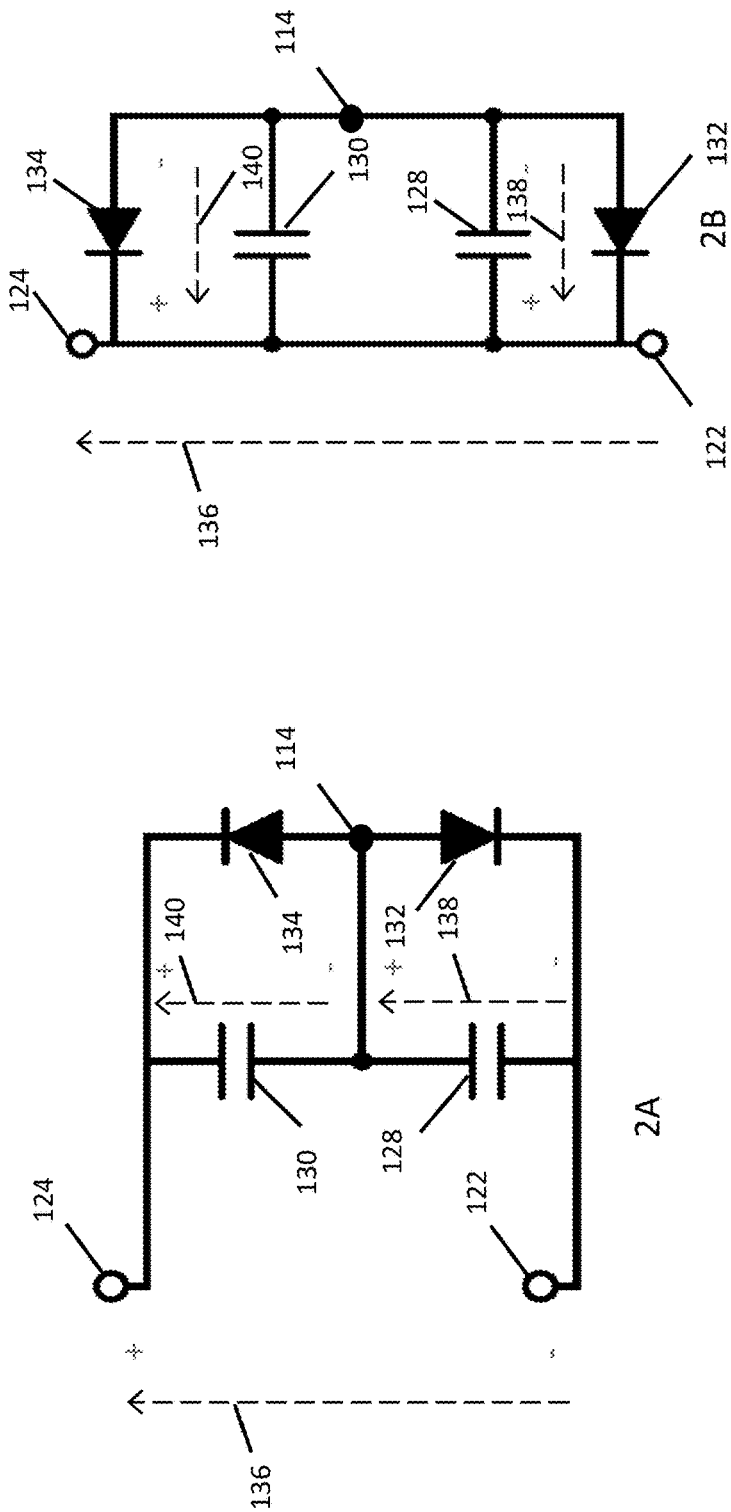
FIG. 2, which includes

Referring to FIG. 2, equivalent schematics of the bidirectional switch 100 and the network of first and second diodes 132, 134 are depicted during different modes of operation of the bidirectional switch 100. FIG. 2A depicts an equivalent schematic when the bidirectional switch 100 is in an OFF state and the second input-output terminal 124 is at a higher potential than the first input-output terminal 122. For exemplary purposes of discussion, a voltage difference 136 of 200V will be used. FIG. 2B depicts an equivalent schematic when the bidirectional switch 100 is transitioned to an ON state after the operational state of FIG. 2A.

Referring to FIG. 2A, because the bidirectional switch 100 is turned OFF, the connection between the first and second input-output terminals 122, 124 appears as an electrical open. Thus, the voltage difference 136 between the first and second input-output terminals 122, 124 is applied to a voltage divider network that includes the first and second substrate capacitances 130, 128 and the first and second diode 132, 134. At this voltage polarity, the first diode 132 is in forward conducting mode. The voltage 138 across the first substrate capacitance 128 corresponds to the forward threshold voltage of the first diode 132, and is therefore very small (e.g., about 1V). The voltage 140 across the second substrate capacitance 130 corresponds to the remaining voltage difference between the first and second input-output terminals 122, 124, and is therefore very large 136 (e.g., about 199V). In other words, the first and second diodes 132, 134 are arranged in a way that essentially ties the first input-output terminal 122 to the substrate potential, and maintains the entire applied voltage difference 136 between the second input-output terminal 124 and the substrate region 114. This condition is desirable, as it effectively mimics the effect of a substrate contact (minus the forward voltage of one diode) in a unidirectional device.

Referring to FIG. 2B, because the bidirectional switch 100 is turned ON, a conductive connection between the first and second input-output terminals 122, 124 is provided. Thus, the voltage difference 136 between the first and second input-output terminal 124 changes to 0V. Moreover, this connection reconfigures the voltage divider network that includes the first and second substrate capacitances 128, 130 and the first and second diodes 132, 134. Now, the circuit includes parallel connected first and second substrate capacitances 128, 130 and first and second diodes 132, 134. At the instant that the circuit transitions to this state, the charges stored in the first and second substrate capacitances 128, 130 redistribute throughout the circuit until an equilibrium condition is reached. However, due to the presence of the first and second diodes 132, 134, the charges stored in the first second substrate capacitances 128, 130 are blocked from discharging through the first and second input-output terminals 122, 124. Instead, the charges redistribute until an equilibrium state is reached between the first second substrate capacitances 128, 130. As a result, the voltage 138 across the first substrate capacitance 128 corresponds to roughly half of the previous voltage difference 136 (e.g., about 99V) and the voltage 140 across the second substrate capacitance 130 corresponds to roughly half of the previous voltage difference 136 (e.g., about 99V).

Thus, while the network of first and second diodes 132, 134 depicted in FIG. 1 provides desirable substrate shunting behavior in the OFF state of the bidirectional switch 100, the transition from OFF to ON creates an undesirable condition in which the previously applied voltage is shared across the voltage divider that includes the first and second substrate capacitances 128, 130, and there is no path for the charges to dissipate until the device is turned OFF again.

Figure 3:
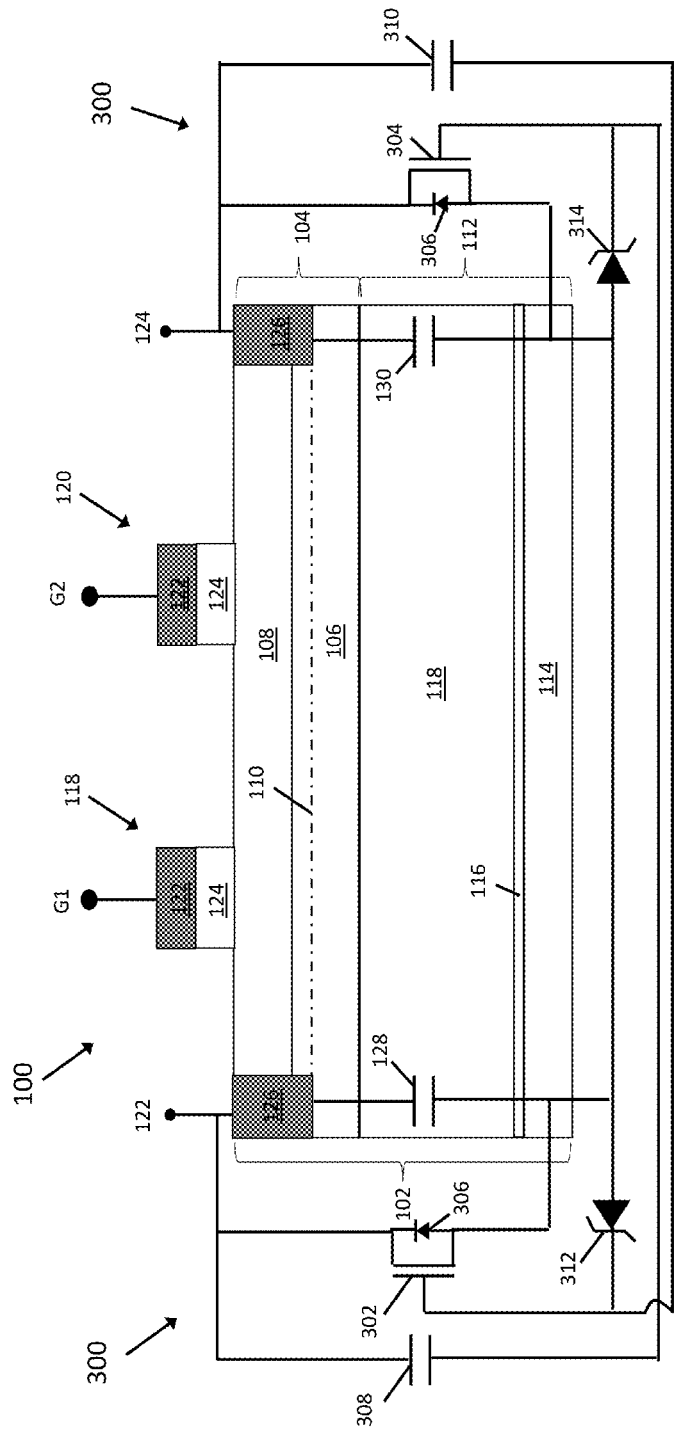
FIG. 3 illustrates a bidirectional switch with a substrate voltage regulation circuit connected between the input-output terminals of the bidirectional switch and the substrate region of the bidirectional switch, according to an embodiment.
Figure 4:
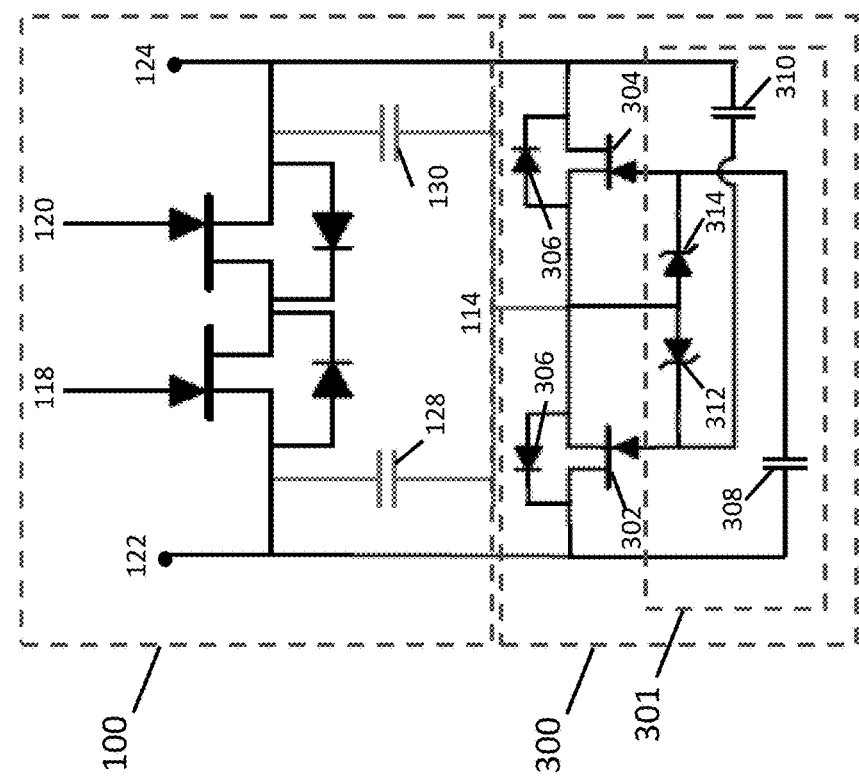
FIG. 4 illustrates an equivalent circuit schematic of a bidirectional switch with a substrate voltage regulation circuit connected between the input-output terminals of the bidirectional switch and the substrate region of the bidirectional switch, according to an embodiment.

Referring to FIGS. 3 and 4, a semiconductor device is depicted, according to another embodiment. The semiconductor device includes the bidirectional switch 100 that is formed in the semiconductor body 102 as described with reference to FIG. 1. Different to the embodiment of FIG. 1, the first and second diodes 132, 134 can be replaced or added in addition with a substrate voltage control circuit 300. FIG. 3 illustrates a substrate configuration of the bidirectional switch 100 with the substrate voltage control circuit 300 being schematically depicted. FIG. 4 illustrates a complete circuit schematic of the circuit that includes the bidirectional switch 100 and the substrate voltage control circuit 300.

The substrate voltage control circuit 300 includes first and second switching devices 302, 304. The first switching device 302 is connected between the substrate region 114 and the first input-output terminal 122. Thus, by turning the first switching device 302 ON, a conductive electrical connection is provided between the substrate region 114 and the first input-output terminal 122. Likewise, the second switching device 304 is connected between the substrate region 114 and the second input-output terminal 124. Thus, by turning the second switching device 304 ON, a conductive electrical connection is provided between the substrate region 114 and the second input-output terminal 124.

The first and second switching devices 302, 304 can be any of a wide variety of electronic switching devices that are configured to complete or remove an electrical connection in response to a control signal. Exemplary switching devices include metal-oxide semiconductor field effect transistors (MOSFETs), insulated gate bipolar transistors (IGBTs), bipolar junction transistors (BJTs), junction field effect transistors (JFETs), high electron mobility transistors (HEMTs), etc. The first and second switching devices 302, 304 can be formed in a wide variety of semiconductor technologies including type IV semiconductor technology, e.g., Silicon (Si), Silicon carbide (SiC), Silicon germanium (SiGe) etc., and type III-V semiconductor technology, III-V semiconductor technology, e.g., gallium nitride (GaN), gallium arsenide (GaAs), etc.

The first and second switching devices 302, 304 can be voltage controlled switching devices. That is, the first and second switching devices 302, 304 can provide an electrically conductive connection by applying a voltage difference 136 between a control terminal (e.g., the gate) and a reference terminal (e.g., the source) of the device. Alternatively, the first and second switching devices 302, 304 can be current controlled switching devices. That is, the conductive electrically connection is achieved by injecting current into the control terminal of the device.

As can be seen, each of the first and second switching devices 302, 304 may include a reverse conducting diode 306 that is connected antiparallel to the conduction path of the switching device. This reverse conducting diode 306 may be inherent to the structure of the switching device 302 and 304. For example, in the case of a typical silicon based MOSFET device, the body diode that intrinsically arises at the p-n junction between the body and source regions can provide this reverse conducting diode 306. Alternatively, the reverse conducting diode 306 may be separately incorporated into the device.

According to an embodiment, the first and second switching devices 302, 304 are integrated into the same semiconductor body 102 as the bidirectional switch 100. That is, the first and second switching devices 302, 304 and the bidirectional switch 100 form a single integrated circuit. Depending on the technology employed, the first and second switching devices 302, 304 can be provided directly beneath the upper active region 104. Alternatively, the first and second switching devices 302, 304 can be formed in region of the semiconductor body 102 (not shown) that is laterally adjacent to the bidirectional switch 100. In one particular embodiment, the bidirectional switch 100 is a type III-V semiconductor device (as shown in the figure) and the first and second switching devices 302, 304 are also type III-V semiconductor devices that are incorporated into the same semiconductor body 102. For example, the first and second switching devices 302, 304 can be GaN based HEMTs devices that are incorporated into the same substrate as a GaN based bidirectional switch 100. In one more particular embodiment, the first and second switching devices 302, 304 are configured as current controlled switches. This configuration can be achieved by configuring the gate structures of the first and second switching devices 302, 304 to inject current into the channel of the device. Alternatively, the first and second switching devices 302, 304 can be provided by discrete components that are separate from the semiconductor body 102.

The substrate voltage control circuit 300 additionally includes a passive electrical network 301 (identified in FIG. 4) that is connected to the control terminals of the first and second switching devices 302, 304, the substrate region 114, and the first and second input-output terminals 122, 124. In general, the passive electrical network 301 can include any of a wide variety of passive electrical components such as resistors, capacitors, inductors, etc. As used herein, a passive electrical component refers to any electrical component that provides a known IV response that is not controlled by an independent signal.

The passive electrical network 301 includes a first capacitance 308 that is connected between the control terminal of the second switching device 304 and the first input-output terminal 122 and a second capacitance 310 that is connected between the control terminal of the first switching device 302 and the second input-output terminal 124.

The first and second capacitances 308, 310 can be provided using a variety of different techniques and structures. For example, the first and second capacitances 308, 310 can be provided by a parallel-plate capacitor structure that is specifically designed as such. As another example, the first and second capacitances 308, 310 can be provided from the parasitic capacitance of a variety of different structures, e.g., wire connections, transistor devices, etc. that are not necessarily designed exclusively to provide the behavior of a capacitor. In either case, these structures can be integrated into the same semiconductor body 102 as the bidirectional switch 100 in a different region (not shown) and electrically connected using known interconnect techniques. Alternatively, the first and second capacitances 308, 310 can be provided by discrete devices that are external to the semiconductor body 102.

The passive electrical network 301 can additionally include a first voltage limiting element 312 connected between the substrate region 114 and the control terminal of the first switching device 302. The first voltage limiting element 312 is configured to limit an input voltage applied to the first switching device 302 to below a maximum rated input voltage of the first switching device 302. The maximum rated input voltage corresponds to a value that the first switching device 302 can accommodate without failure. The first voltage limiting element 312 blocks any voltage below the maximum rated input voltage, and begins conducting once the maximum rated input voltage is reached. According to an embodiment, the first voltage limiting element 312 is a Zener diode, wherein the reverse conducting Zener voltage corresponds to the maximum rated input voltage of the first switching device 302. More generally, the first voltage limiting element 312 can be any kind of voltage limiting device (e.g., Schottky diode, PIN diode, MOV, etc.) that provides similar functionality.

The passive electrical network 301 additionally includes a second voltage limiting element 314 connected between the substrate region 114 and an input of the first switching device 302. The second voltage limiting element 314 is configured to limit a voltage applied to the control terminal of the second switching device 304 to below a maximum rated input voltage of the second switching device 304 in a similar manner as previously described with reference to the first voltage limiting element 312. Similarly, the second voltage limiting element 314 can be a Zener diode, wherein the reverse conducting Zener voltage corresponds to the maximum rated input voltage of the second switching device 304. Alternatively, the second voltage limiting element 314 can be any kind of voltage limiting device (e.g., Schottky diode, PIN diode, MOV, etc.) that provides similar functionality.

Advantageously, the passive electrical network 301 of the substrate voltage control circuit 300 is configured to operate the first and second switching devices 302, 304 in such a way that alleviates the trapped charges condition as described with reference to FIG. 2B. Moreover, the passive electrical network 301 is configured to generate the necessary control signaling to turn the first and second switching devices 302, 304 ON and OFF without any external or independent signaling. Instead, the control signaling is derived from the voltages that are applied across the first and second input-output terminals 122, 124.

In a first transitional state of the bidirectional switch 100 at which the second input-output terminal 124 is at a higher potential than the first input-output terminal 122 and the bidirectional switch 100 is transitioned from OFF to ON (i.e., the condition described with reference to FIG. 1), the passive electrical network 301 generates a first substrate reference signal that, at least temporality, turns the second switching device 304 ON. As a result, a short circuit path exists for the charges stored in the first and second substrate capacitances 128, 130 to dissipate. In a second transitional state of the bidirectional switch 100 at which the first input-output terminal 122 is at a second potential than the first input-output terminal 122 and the bidirectional switch 100 is transitioned from OFF to ON, the passive electrical network 301 generates a second substrate reference signal that, at least temporality, turns the first switching device 302 ON. Again, this creates short circuit path that allows the charges stored in the first and second substrate capacitances 128, 130 to dissipate.

A working example of how the passive electrical network 301 generates the first substrate reference signal during the first transitional state will now be discussed with reference to FIGS. 5-8. Each of these figures contain a complete circuit schematic of the circuit that includes the bidirectional switch 100 and the substrate voltage control circuit 300.

Figure 5:
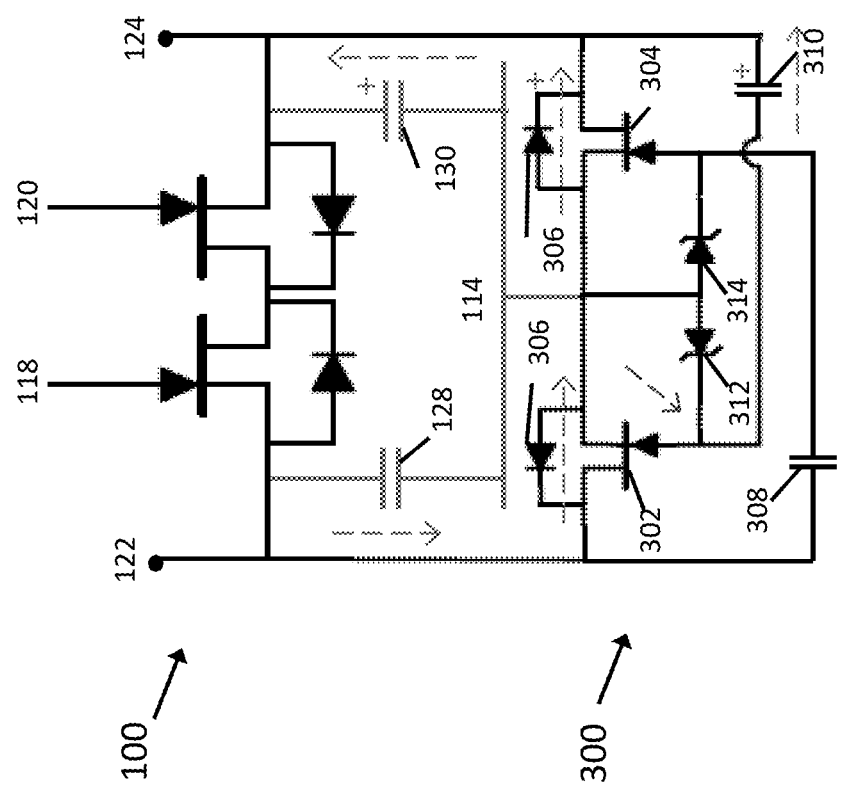
FIG. 5 illustrates the various voltages present on the bidirectional switch and the substrate voltage regulation circuit during a steady OFF state of the bidirectional switch, according to an embodiment.

Referring to FIG. 5, the first gate structure 118 is turned OFF, and the second gate structure is either ON or OFF. As a result, the bidirectional switch 100 is in an OFF state and can maintain a voltage difference across the first and second input-output terminals 122, 124. In this example, a voltage difference is applied to the input-output terminals such that the second input-output terminal 124 as at a higher potential than the first input-output terminal 122. For the exemplary purposes of discussion, a voltage difference of 400 V will be used. This 400V is applied across the voltage divider network formed by the first and second substrate capacitances 128, 130 and the substrate voltage control circuit 300. The voltage across the gate and reference terminal of the first switching device 302 is slightly below the threshold voltage of the gate diode of the first switching device 302. Thus, the first switching device 302 is turned OFF. Because the first switching device 302 has a reverse conducting diode 306 that is forward conducting at this bias polarity, the voltage across the first substrate capacitance 128 corresponds to the forward conducting voltage (i.e., the forward threshold voltage) of the reverse conducting diode 306 of the first switching device 302. As an example, this voltage is 1 V. The remaining 399 V is applied across the second substrate capacitance 130. In addition, this voltage is applied across the second capacitance 310 and the second switching device 304, which are in parallel with the second substrate capacitance 130. In other words, the substrate voltage control circuit 300 produces a voltage divider condition similar to that described with reference to FIG. 2A.

Figure 6:
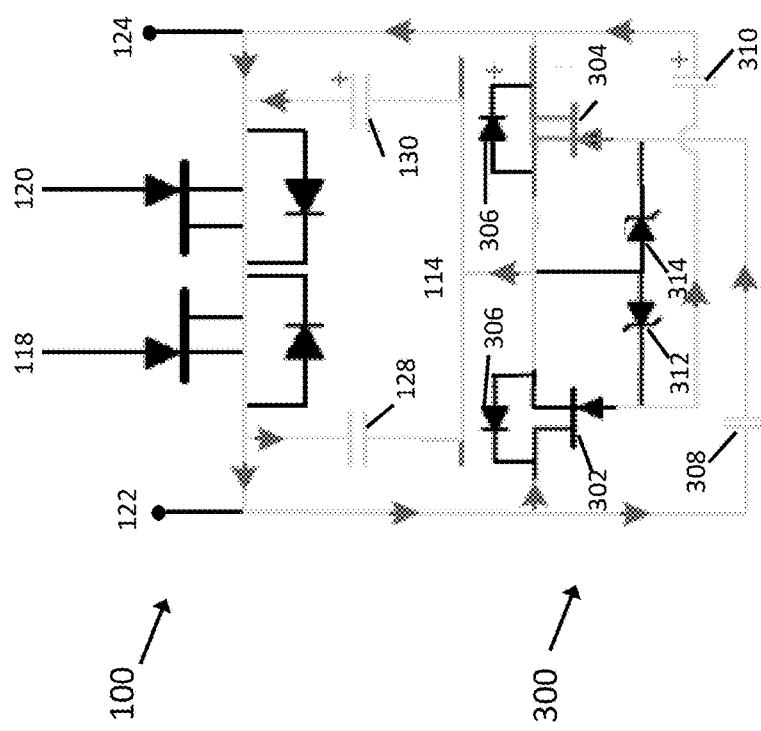
FIG. 6 illustrates the various voltages present on the bidirectional switch and the substrate voltage regulation circuit during a transitional state of the bidirectional switch from OFF to ON, according to an embodiment.

Referring to FIG. 6 the bidirectional switch 100 is transitioned from OFF to ON after being in the previous bias condition described with reference to FIG. 5. This transition occurs by applying the necessary signals to turn the first and second gate structures 118, 120 ON. Thus, a low resistance connection forms between the first and second input-output terminals 122, 124 and the voltage across the first and second input-output terminals 124 drops from 400V to approximately 0V. Once this happens, the charges stored in the first substrate capacitance 128 and the second capacitance 310 redistribute throughout the circuit via the channel 110. In particular, this redistribution of charges occurs causes the first capacitance 308 to charge. The charging of this first capacitance 308 results in a temporary current being present at the control terminal of the second switching device 304. Because the second switching device 304 is a current controlled switch, this current is sufficient to temporarily place the second switching device 304 in an ON state. Once the second switching device 304 is turned ON, it provides a short circuit path for the charges stored in the first and second substrate capacitances 128, 130 as well as other associated capacitances in the reverse conducting diode 306 and t the second capacitance 310 to dissipate via the first and second input-output terminals 122, 124. Thus, different to the scenario described with reference to FIG. 2B in which the charges stored across the first and second substrate capacitances 128, 130 are blocked by the first and second diodes 132, 134, the second switching device 304 provides an alternate path for these charges to discharge.

Figure 7:
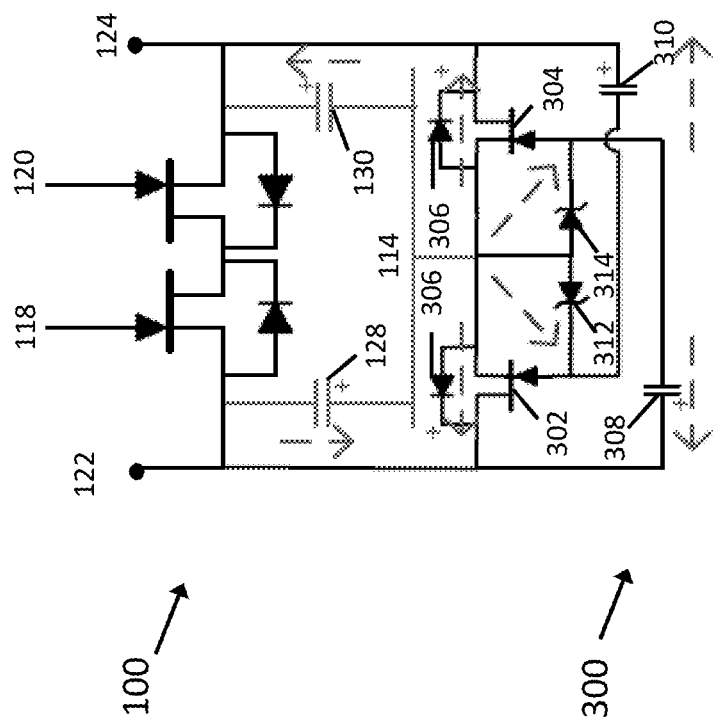
FIG. 7 illustrates the various voltages present on the bidirectional switch and the substrate voltage regulation circuit during a steady ON state of the bidirectional switch, according to an embodiment.

Referring to FIG. 7, a steady ON state of the bidirectional switch 100 is depicted. In the steady ON state of the bidirectional switch 100, the control terminal voltage of the first switching device 302 is practically at zero volts and the control terminal of the second switching device 304 is below its threshold voltage. Because the second switching device 304 is controlled by a temporary current provided by the first capacitance 308, the second switching device 304 was only in the ON state temporarily while the bidirectional switch 100 transitions from OFF to ON. Once the first capacitance 308 is no longer charging, the current at the control terminal of the second switching device 304 will subside and the second switching device 304 will automatically turn off. The temporary ON state condition of the second switching device 304 may not necessarily discharge all charges stored in the first and second substrate capacitances 128, 130. In some cases, a minimal voltage (e.g., 15V or less) may remain across first and second substrate capacitances 128, 130 while the bidirectional switch 100 is operating in the steady ON state. However, these voltages are low enough to effectively eliminate the problems of the fully charged voltage divider condition described with reference to FIG. 2B. Moreover, the amount of remaining charges stored (and hence voltage) on the first and second substrate capacitances 128, 130 after the second switching device 304 is turned OFF can be tuned by altering device parameters of the substrate voltage control circuit 300 such as, capacitance of the first capacitance 308, on-resistance of the second switching device 304, turn-on behavior of the second switching device 304, etc.

Figure 8:
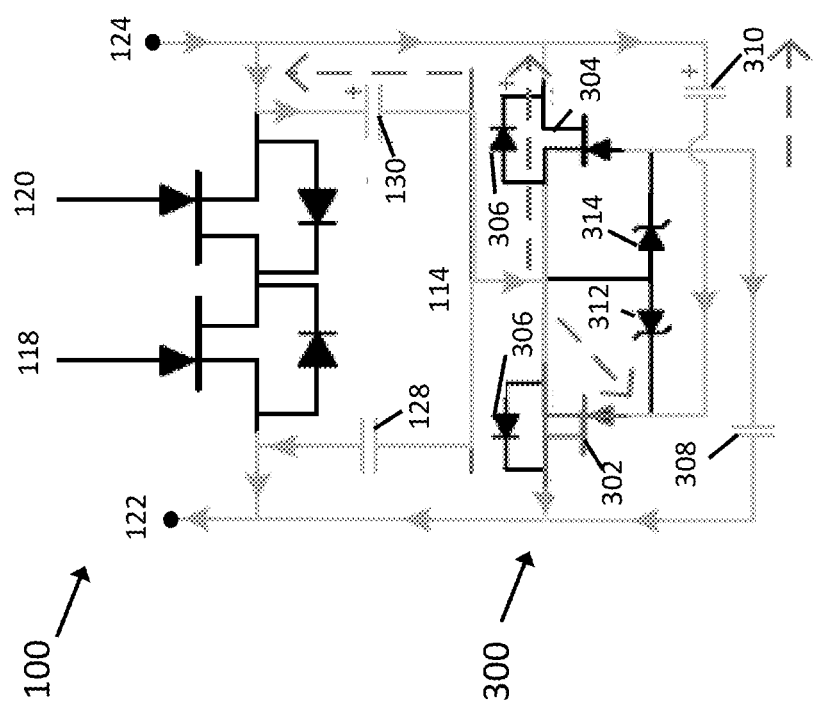
FIG. 8 illustrates the various voltages present on the bidirectional switch and the substrate voltage regulation circuit during a transitional state of the bidirectional switch from OFF to ON, according to an embodiment.

Referring to FIG. 8, the bidirectional switch 100 is transitioned from the ON state to the OFF state by turning the first gate structure 118 OFF. The channel 110 of the device is now non-conductive. During the transitional period from the ON state to the OFF state, the majority of the voltage applied to the first and second input-output terminals 122, 124 is now distributed across the second substrate capacitance 130, the second capacitance 310 and the second switching device 304. Although charging the second capacitance 310, which is in series with the control terminal of the first switching device 302, temporarily turns the first switching device 302 ON and thus temporarily shorts the first substrate capacitance 128, this state will quickly transition to the steady OFF state once the temporary charging current subsides and the first switching device 302 turns OFF. As a result, the voltage distribution will ultimately revert to the state described with reference to FIG. 5.

The previously described second substrate reference signal is generated during the second transitional state, i.e., wherein the first input-output terminal 124 is at a higher potential than the second input-output terminal 122 and the bidirectional switch 100 is transitioned from OFF to ON, in a corresponding manner using counterpart components of the substrate voltage control circuit 300. To summarize, in the second transitional state, the majority of the voltage difference between the first and second input-output terminals 122, 124 (399 V using the exemplary values described above) is initially placed across the first substrate capacitance 130. This redistribution of charges results in a temporary current at the control terminal of the first switching device 302 to alleviate the blocking voltage divider condition in a similar manner as previously described.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device may have AlInN/AlN/GaN barrier/spacer/buffer layer structures. In general, the normally-off compound semiconductor transistor can be realized using any suitable III-nitride technology such as GaN that permits the formation of opposite polarity inversion regions due to piezoelectric effects.

Specifically with regard to GaN technology, the presence of polarization charges and strain effects in a GaN-based heterostructure body due to piezoelectric effects yield a two-dimensional charge carrier gas in the heterostructure body characterized by very high carrier density and carrier mobility. Such a two-dimensional charge carrier gas, such as a 2DEG (two-dimensional electron gas) or 2DHG (two-dimensional hole gas), forms the conductive channel of the HEMT near the interface between, e.g., a GaN alloy barrier region and a GaN buffer region. A thin, e.g. 1-2 nm, AlN layer can be provided between the GaN buffer region and the GaN alloy barrier region to minimize alloy scattering and enhance 2DEG mobility. In a broad sense, the compound semiconductor transistors described herein can be formed from any binary, ternary or quaternary III-nitride compound semiconductor material where piezoelectric effects are responsible for the device concept.

Spatially relative terms such as "under," "below," "lower," "over," "upper," "above," "beneath" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

Terms such as "same," "match," and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body comprising an active region and a substrate region that is disposed beneath the active region,
a bidirectional switch formed in the semiconductor body and configured to block voltage across two polarities, the bidirectional switch comprising: first and second gate structures that are each configured to control a conductive state of an electrically conductive channel that is disposed in the upper active region, and first and second input-output terminals that are each in ohmic contact with the electrically conductive channel;
a first switching device configured to electrically connect the substrate region to the first input-output terminal;
a second switching device configured to electrically connect the substrate region to the second input-output terminal;
a passive electrical network comprising a first capacitance and a second capacitance, the first capacitance being connected between a control terminal of the second switching device and the first input-output terminal, the second capacitance being connected between a control terminal of the first switching device and the second input-output terminal;
wherein the passive electrical network is configured to temporarily electrically connect the substrate region to the second input-output terminal by turning the second switching device on when the second input-output terminal is at a higher potential than the first input-output terminal, and
wherein the passive electrical network is configured to temporarily electrically connect the substrate region to the first input-output terminal by turning the first switching device on when the first input-output terminal is at a higher potential than the second input-output terminal.

2. The semiconductor device of claim 1, wherein the first and second switching devices are current controlled switches, wherein the first capacitance is configured to supply a temporary current to the control terminal of the second switching device during a transition of the bidirectional switch from a blocking state to a conducting state at a first voltage polarity of the bidirectional switch, and wherein the second capacitance is configured to supply a temporary current to the control terminal of the first switching device during a transition of the bidirectional switch from a blocking state to a conducting state at a second voltage polarity of the bidirectional switch, the second voltage polarity being opposite from the first voltage polarity.

3. The semiconductor device of claim 2, wherein the semiconductor body comprises a type III semiconductor nitride, wherein the bidirectional switch is a high electron mobility transistor, and wherein the electrically conductive channel is a two-dimensional charge carrier gas.

4. The semiconductor device of claim 3, wherein the first and second switching devices are high-electron-mobility transistors that are integrally formed in the semiconductor body.

5. The semiconductor device of claim 1, wherein the first capacitance is exclusively connected between the control terminal of the second switching device and the first input-output terminal, and wherein the second capacitance is exclusively connected between the control terminal of the first switching device and the second input-output terminal.

6. The semiconductor device of claim 1, wherein the passive electrical network further comprises:
a first voltage limiting element connected between the substrate region and an input of the first switching device;
a second voltage limiting element connected between the substrate region and an input of the first switching device;
wherein the first voltage limiting element is configured to limit a voltage applied to the control terminal of the first switching device to below a maximum rated input voltage of the first switching device, and wherein the second voltage limiting element is configured to limit a voltage applied to the control terminal of the second switching device to below a maximum rated input voltage of the second switching device.

7. The semiconductor device of claim 1, wherein the first and second switching devices are integrated within the semiconductor body.

8. The semiconductor device of claim 7, wherein the passive electrical network is integrated within the semiconductor body and is exclusively connected to the first and second input-output terminals, the first and second switching devices and the substrate region.

9. A semiconductor device, comprising:
a semiconductor body comprising an active region and a substrate region that is disposed beneath the active region,
a bidirectional switch formed in the semiconductor body and configured to block voltage across two polarities, the bidirectional switch comprising: first and second gate structures that are each configured to control a conductive state of an electrically conductive channel that is disposed in the upper active region, and first and second input-output terminals that are each in ohmic contact with the electrically conductive channel;
a first switching device that is configured to electrically connect the first input-output terminal to the substrate when turned on;
a second switching device that is configured to electrically connect the second input-output terminal to the substrate when turned on;
a passive electrical network that is configured to generate a first substrate reference signal that turns the second switching device on during a first transitional state of the bidirectional switch and to generate a second substrate reference signal that turns the first switching device on during a second transitional state of the bidirectional switch, the first transitional state being a state when the second input-output terminal is at a higher potential than the first input-output terminal and the bidirectional switch is turned on, the second transitional state being a state when the first input-output terminal is at a higher potential than the second input-output terminal and the bidirectional switch is turned on.

10. The semiconductor device of claim 9, wherein the self-biasing passive electrical network comprises a first capacitance and a second capacitance, the first capacitance being connected between a control terminal of the second switching device and the first input-output terminal, the second capacitance being connected between a control terminal of the first switching device and the second input-output terminal, wherein the first capacitance is configured to provide the first substrate reference signal during the first transitional state, and wherein the second capacitance is configured to provide the second substrate reference signal during the second transitional state.

11. The semiconductor device of claim 10, wherein the first and second switching devices are current controlled switches, wherein the self-biasing passive electrical network is configured to generate the first substrate reference signal by providing a temporary current pulse at the control terminal of the second switching device from a redistribution of charges occurring during the first transitional state, and wherein the self-biasing passive electrical network is configured to generate the second substrate reference signal by providing a temporary current pulse at the control terminal of the first switching device from a redistribution of charges occurring during the second transitional state.

12. The semiconductor device of claim 11, wherein the semiconductor body comprises a type III semiconductor nitride, wherein the bidirectional switch is a high electron mobility transistor, and wherein the electrically conductive channel is a two-dimensional charge carrier gas.

13. The semiconductor device of claim 12, wherein the first and second switching devices are high-electron-mobility transistors that are integrally formed in the semiconductor body.

14. The semiconductor device of claim 13, wherein the first capacitance is exclusively connected between the control terminal of the second switching device and the first input-output terminal, and wherein the second capacitance is exclusively connected between the control terminal of the first switching device and the second input-output terminal.

15. A method of operating a bidirectional switch configured to block voltage across two polarities, the bidirectional switch comprising a semiconductor body comprising an active region and a substrate region that is disposed beneath the active region, first and second gate structures that are each configured to control a conductive state of an electrically conductive channel that is disposed in the upper active region, and first and second input-output terminals that are each in ohmic contact with the electrically conductive channel, the method comprising:
using a second switching device to temporarily electrically connect the substrate region to the second input-output terminal during a first transitional state of the bidirectional switch, the first transitional state of the bidirectional switch being a state when the second input-output terminal is at a higher potential than the first input-output terminal and the bidirectional switch is transitioned from OFF to ON;
using a first switching device to temporarily electrically connect the substrate region to the first input-output terminal during a second transitional state of the bidirectional switch, the second transitional state of the bidirectional switch being a state when the first input-output terminal is at a higher potential than the second input-output terminal and the bidirectional switch is transitioned from OFF to ON; and
wherein using the first switching device and using the second switching device comprises turning the first and second switching devices on using a self-biasing passive electrical network that generates a current pulse from transitioning of the bidirectional switch.

16. The method of claim 15, wherein the self-biasing passive electrical network comprises a first capacitance and a second capacitance, the first capacitance being connected between a control terminal of the second switching device and the first input-output terminal, the second capacitance being connected between a control terminal of the first switching device and the second input-output terminal.

17. The method of claim 16, wherein the self-biasing passive electrical network provides a first temporary current pulse at the control terminal of the second switching device during the during the first transitional state, and wherein the self-biasing passive electrical network provides a second temporary current pulse at the control terminal of the first switching device during the during the second transitional state.

18. The method of claim 17, wherein the first capacitance generates the first temporary current pulse from a redistribution of charges that occurs in the bidirectional switch during the first transitional state, and wherein the second capacitance generates the second temporary current pulse from a redistribution of charges that occurs in the bidirectional switch during the second transitional state.

19. The method of claim 15, wherein the bidirectional switch, the first switching device and the second switching device are integrally formed in the semiconductor body, and wherein the self-biasing passive electrical network turns the first and second switching devices ON exclusively using voltages supplied to the first and second input-output terminals.

* * * * *